US011437964B2

(12) United States Patent
Ito (10) Patent No.: US 11,437,964 B2
(45) Date of Patent: Sep. 6, 2022

(54) TRANSCEIVER MODULE (71) Applicant: Murata Manufacturing Co., Ltd., Kyoto (JP)

(72) Inventor: Masahiro Ito, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/925,540

(22) Filed: Jul. 10, 2020

(65) Prior Publication Data
US 2021/0013853 A1 Jan. 14, 2021

(30) Foreign Application Priority Data

Jul. 12, 2019 (JP) .............................. JP2019-130428

(51) Int. Cl.
*H03F 9/00* (2006.01)
*H03F 3/45* (2006.01)
*H04B 1/40* (2015.01)

(52) U.S. Cl.
CPC .......... *H03F 3/45475* (2013.01); *H04B 1/40* (2013.01); *H03F 2200/294* (2013.01); *H03F 2200/451* (2013.01); *H03F 2203/45638* (2013.01)

(58) Field of Classification Search
CPC ...................................................... H03F 9/00
USPC ................................................ 330/165, 195
See application file for complete search history.

(56) References Cited

U.S. PATENT DOCUMENTS

| 7,248,844 | B2* | 7/2007 | Rofougaran ........ H01L 27/0251 455/117 |
| 7,538,741 | B2* | 5/2009 | Castaneda .............. H01Q 1/242 343/749 |
| 9,729,192 | B2 | 8/2017 | Conta et al. |
| 10,903,806 | B2* | 1/2021 | Anderson ........... H01F 27/2804 |
| 2006/0040621 | A1 | 2/2006 | Rofougaran |
| 2008/0100526 | A1 | 5/2008 | Castaneda et al. |
| 2014/0314132 | A1 | 10/2014 | Leuschner et al. |
| 2016/0268983 | A1* | 9/2016 | Matsuno ................... H03F 1/52 |
| 2017/0070199 | A1 | 3/2017 | Anderson et al. |
| 2021/0067183 | A1* | 3/2021 | Abbasi .................... H03F 3/195 |

FOREIGN PATENT DOCUMENTS

| CN | 102263572 A | 11/2011 |
| CN | 103378869 A | 10/2013 |

OTHER PUBLICATIONS

Office Action for Chinese Patent Application No. 202010654522.9 dated Sep. 14, 2021.

* cited by examiner

*Primary Examiner* — Henry Choe
(74) *Attorney, Agent, or Firm* — Pearne & Gordon LLP (57) ABSTRACT

A transceiver module according to an embodiment of the present disclosure includes a power amplifier, a first transformer, a low-noise amplifier, and a second transformer. The power amplifier amplifies a transmission signal for outputting to an antenna terminal. The first transformer includes a first winding and a second winding. The first winding is connected to the antenna terminal, and the second winding is connected to an output side of the power amplifier. The low-noise amplifier amplifies a reception signal inputted through the antenna terminal. The second transformer includes the first winding and a third winding connected to an input side of the low-noise amplifier.

19 Claims, 7 Drawing Sheets

TRANSCEIVER MODULE

This application claims priority from Japanese Patent Application No. 2019-130428 filed on Jul. 12, 2019. The content of this application is incorporated herein by reference in its entirety.

BACKGROUND OF THE DISCLOSURE

1. Field of the Disclosure

The present disclosure relates to a transceiver module.

2. Description of the Related Art

A recent trend toward miniaturization of front-end modules that are to be incorporated into devices such as mobile terminals has promoted tighter packaging of radio-frequency components to achieve integration (modularization) of a transmission front end and a reception front end.

U.S. Pat. No. 9,729,192 discloses a radio-frequency (RF) front end including a power amplifier, a low-noise amplifier, and a transformer. The transformer of the RF front end includes: a first winding, both ends of which are connected to a power amplifier that is a differential amplifier; and a second winding, one end of which is connected to an antenna and the other end of which is connected to a low-noise amplifier. The RF front end also includes a switch operable to connect the other end of the second winding to the ground. The switch is closed during operation in a transmission mode and is open during operation in a reception mode.

The configuration disclosed in U.S. Pat. No. 9,729,192 requires an impedance matching circuit between the low-noise amplifier and the second winding of the transformer to optimize the characteristics of the transformer in accordance with the characteristics of the power amplifier and is thus unfavorable for miniaturization of transceiver modules.

BRIEF SUMMARY OF THE DISCLOSURE

The present disclosure therefore has an object to provide a transceiver module that eliminates the need to include an impedance matching circuit between a transformer and a low-noise amplifier.

A transceiver module according to an embodiment of the present disclosure includes a power amplifier, a first transformer, a low-noise amplifier, and a second transformer. The power amplifier amplifies a transmission signal for output to an antenna terminal. The first transformer includes a first winding and a second winding. The first winding is connected to the antenna terminal, and the second winding is connected to an output side of the power amplifier. The low-noise amplifier amplifies a reception signal inputted through the antenna terminal. The second transformer includes the first winding and a third winding connected to an input side of the low-noise amplifier.

In this embodiment, the second transformer enables impedance conversion between the antenna terminal and the low-noise amplifier. The transceiver module thus eliminates the need to include an impedance matching circuit between the second transformer and the low-noise amplifier.

Other features, elements, characteristics, and advantages of the present disclosure will become more apparent from the following detailed description of preferred embodiments of the present disclosure with reference to the attached drawings.

DETAILED DESCRIPTION OF THE DISCLOSURE

Preferred embodiments of the present disclosure will be described below with reference to the accompanying drawings. Note that constituent components denoted by the same reference sign in the drawings have the same configuration or similar configurations.

First Embodiment

Figure 1:
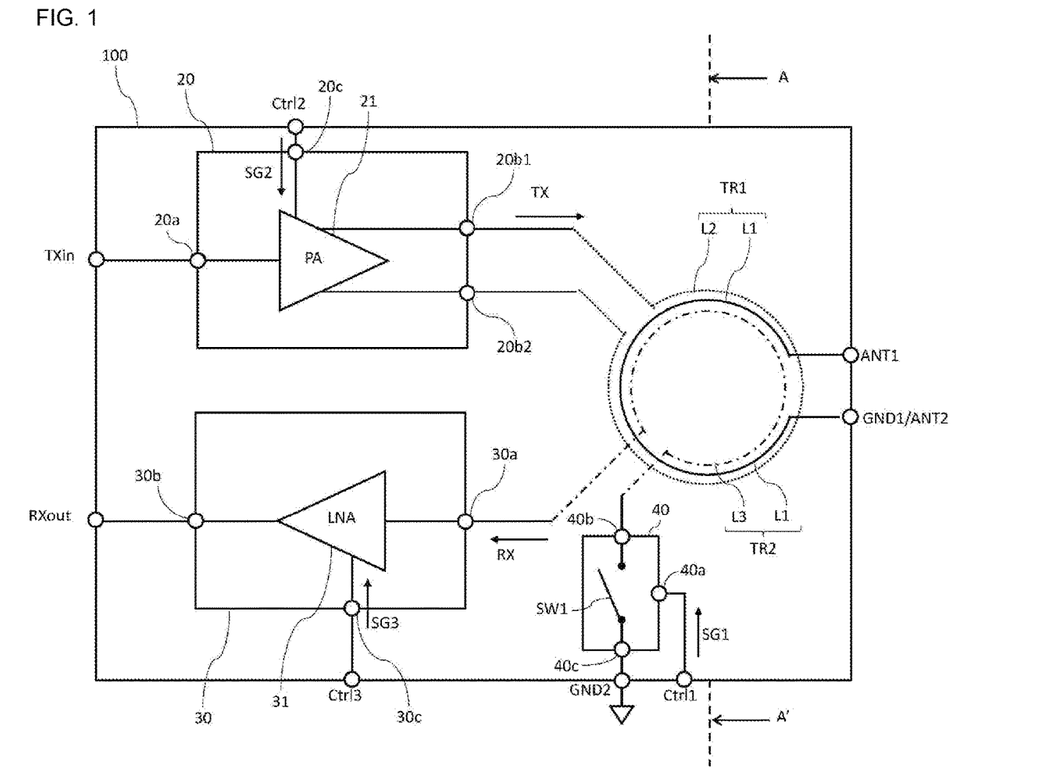
FIG. 1 is a schematic configuration diagram of a transceiver module 100 according to a first embodiment of the present disclosure.

1. Configuration
1-1. Circuit Configuration of Components of Transceiver Module 100
Transceiver Module 100
FIG. 1 is a schematic configuration diagram of a transceiver module 100 according to a first embodiment of the present disclosure. The transceiver module 100 is to be included in a mobile communication device such as a mobile phone and is configured to process signals so as to enable the device to transmit radio-frequency (RF) signals to a base station and to receive RF signals from the base station. The transceiver module 100 has operation modes such as a transmission mode and a reception mode. In the transmission mode, transmission signals TX from, for example, a baseband circuit are amplified, and resulting signals are sent to an antenna. In the reception mode, reception signals RX from the antenna are amplified, and resulting signals are sent to, for example, the baseband circuit.

The transceiver module 100 includes a PA module 20, an LNA module 30, a first winding L1, a second winding L2, a third winding L3, and a switch module 40. The transceiver module 100 has a terminal TXin, terminals ANT, a terminal RXout, a terminal Ctrl1, a terminal Ctrl2, a terminal Ctrl3, a terminal GND1, and a terminal GND2.

PA Module 20
The PA module 20 includes a power amplifier (PA) 21. The power amplifier 21 may be a bipolar transistor or a field effect transistor (FET). The PA module 20 has: a terminal 20a, which is connected to an input terminal of the power amplifier 21; a terminal 20b1 and a terminal 20b2, which are connected to the corresponding output terminals of the power amplifier 21; and a terminal 20c, which is connected to a control terminal of the power amplifier 21. The terminal 20a is also connected to the terminal TXin of the transceiver module 100. The baseband circuit or the like inputs the transmission signals TX to the terminal TXin. The transmission signals TX from the terminal TXin are then applied to the terminal 20a.

The power amplifier 21, which is a differential amplifier, amplifies the power of the transmission signals TX inputted to the terminal 20a and then outputs the resulting transmission signals TX to the terminals 20b1 and 20b2. The terminal 20b1 is connected to one end of the second winding L2, and the terminal 20b2 is connected to the other end of the second winding L2. The transmission signals TX respectively outputted through the terminals 20b1 and 20b2 are sent to the second winding L2 accordingly. The input terminal 20a of the PA module 20 or the terminal TXin may or may not be a terminal for unbalanced input or may be a terminal for balanced input.

The terminal 20c is connected to the terminal Ctrl2 of the transceiver module 100. Control signals SG2 for controlling the power amplifier 21 are inputted to the terminal Ctrl2. The signals applied to the terminal Ctrl2, namely, the control signals SG2 for controlling the power amplifier 21 are then sent to the power amplifier 21 through the terminal 20c. The control signals SG2 may be synchronized with control signals SG1 for controlling a switch SW1, which will be described later.

Transformer TR1
The first winding L1 and the second winding L2 are magnetically coupled with each other to constitute a transformer TR1. The first winding L1, which is an inductor, is wound into a substantially circular shape when viewed in plan. The second winding L2, which is an inductor, is wound into a substantially circular shape when viewed in plan. For convenience, the second winding L2 in FIG. 1 is indicated by a dotted line. The first winding L1 and the second winding L2 may be wound into any shape other than the substantially circular shape and may be wound into, for example, a substantially rectangular shape, a substantially polygonal shape, or an indefinite shape. N1 and N2, which respectively denote the number of winding turns of the first winding L1 and the number of winding turns of the second winding L2, are not limited to particular values, and the number may be one or more.

One end of the first winding L1 is connected to a terminal ANT1, and the other end of the first winding L1 is connected to the terminal GND1 or a terminal ANT2. The terminal ANT1 is connected to the antenna. The terminal GND1 is grounded. The terminal ANT2 is connected to the antenna. The PA module 20 sends the transmission signals TX to the second winding L2 of the transformer TR1, where due to mutual induction, the transmission signals TX are in turn induced in the first winding L1 magnetically coupled with the second winding L2. The transmission signal TX induced in the first winding L1 are sent to the antenna through the terminal ANT.

The transformer TR1 enables impedance conversion between the first winding L1 side and the second winding L2 side on the path of the transmission signals TX. The equation $Z1/Z2=(N1/N2)^2$ holds for a transformer ideal as the transformer TR1, where Z1 is the impedance on the first winding L1 side and Z2 is the impedance on the second winding L2 side. The transceiver module 100 may be configured as follows: the characteristics of the first winding L1 and the characteristics of the second winding L2 are designed in such a manner that the impedance conversion characteristics of the transformer TR1 are optimized in accordance with the characteristics of the power amplifier 21.

Transformer TR2
The first winding L1 and the third winding L3 are magnetically coupled with each other to constitute a transformer TR2. The third winding L3, which is an inductor, is wound into a substantially circular shape when viewed in plan. For convenience, the third winding L3 in FIG. 1 is indicated by a dash-dot line. The third winding L3 may be wound into any shape other than the substantially circular shape and may be wound into, for example, a substantially rectangular shape, a substantially polygonal shape, or an indefinite shape.

One end of the third winding L3 is connected to a terminal 30a of the LNA module 30, and the other end of the third winding L3 is connected to an end of the switch SW1. The reception signals RX are sent through the terminal ANT to the first winding L1 of the transformer TR2, where due to mutual induction, the reception signals RX are in turn induced in the third winding L3 magnetically coupled with the first winding L1. The reception signals RX induced in the third winding L3 are sent to the LNA module 30 through the terminal 30a.

The transformer TR2 enables impedance conversion between the first winding L1 side and the third winding L3 side on the path of the reception signals RX. Impedance matching may thus be provided without an impedance conversion circuit on the input side of a low-noise amplifier 31. The equation $Z1/Z3=(N1/N3)^2$ holds for a transformer ideal as the transformer TR2, where Z1 is the impedance on the first winding L1 side and Z3 is the impedance on the third winding L3 side. The transceiver module 100 may be configured as follows: the characteristics of the third winding L3 are designed in accordance with the characteristics of the first winding L1 that are designed, as described above, in accordance with the characteristics of the power amplifier 21.

LNA Module 30

The LNA module 30 includes the low-noise amplifier (LNA) 31. The low-noise amplifier 31 may be a bipolar transistor or a field effect transistor (FET). The LNA module 30 has: the terminal 30a connected to an input terminal of the low-noise amplifier 31; a terminal 30b, which is connected to an output terminal of the low-noise amplifier 31; and a terminal 30c, which is connected to a control terminal of the low-noise amplifier 31.

The terminal 30a is connected to an end of the third winding L3 of the transformer TR2. The reception signals RX from the third winding L3 of the transformer TR2 are applied to the terminal 30a accordingly.

The low-noise amplifier 31 amplifies the power of the reception signals RX inputted to the terminal 30a and then outputs the resulting reception signals RX. The terminal 30b is connected to the terminal RXout of the transceiver module 100. The reception signal RX outputted through the terminal 30b are applied to the terminal RXout of the transceiver module 100 and are then outputted to, for example, the baseband circuit through the terminal RXout accordingly.

The terminal 30c is connected to the terminal Ctrl3 of the transceiver module 100. Control signals SG3 for controlling the low-noise amplifier 31 are inputted to the terminal Ctrl3. The signals applied to the terminal Ctrl3, namely, the control signals SG3 for controlling the low-noise amplifier 31 are then sent to the low-noise amplifier 31 through the terminal 30c.

Switch Module 40

The switch module 40 is an example of a switch unit and includes the switch SW1. The switch SW1 may be a bipolar transistor or a field effect transistor (FET). The switch module 40 has a terminal 40a, a terminal 40b, and a terminal 40c. The terminal 40a is connected to the terminal Ctrl1 of the transceiver module 100. The control signals SG1 for controlling the switch SW1 are inputted to the terminal Ctrl1. The signals applied to the terminal Ctrl1, namely, the control signals SG1 for controlling the switch SW1 are then sent to the switch SW1 through terminal 40a. The control signals SG1 may be synchronized with the aforementioned control signals SG2 for controlling the power amplifier 21. The switch SW1 is an example of a switch for opening or closing a circuit through which the reception signals RX are sent from the transformer TR2 to the low-noise amplifier 31.

One end of the switch SW1 is connected to the terminal 40b, and the other end of the switch SW1 is connected to the terminal 40c. The switch SW1 switches between an open state and a closed state in accordance with the control signals SG1 sent through the terminal 40a. While the switch SW1 is open, the circuit through which the reception signals RX are sent from the transformer TR2 to the low-noise amplifier 31 is kept unclosed. While the switch SW1 is closed, the circuit through which the reception signals RX are sent from the transformer TR2 to the low-noise amplifier 31 is closed.

1-2. Layered Structure of Transceiver Module 100 and Layout of Windings

With reference to FIGS. 2A to 2D, 3A to 3D, and 4A to 4D, the following describes the layered structure of the transceiver module 100 and the layout of the windings included in the transformer TR1 and the windings included in the transformer TR2.

The transceiver module 100 may include one or more layers (e.g., a first layer S1, a second layer S2, and a third layer S3, which will be described later) made of low temperature co-fired ceramics (LTCC) and a resin, such as glass epoxy, or liquid crystal polymer. The first winding L1, the second winding L2, and the third winding L3 of the transceiver module 100 may be disposed in the one or more layers as will be described below although the layout of these windings is not limited to the following layouts.

FIGS. 2A to 2D are sectional views of the transceiver module 100 taken along line A-A' in FIG. 1, illustrating examples in which the first winding L1 is disposed between the second winding L2 and the third winding L3. In the present embodiment, the expression "a winding α is disposed between a winding β and a winding γ" means that the vertical position of the winding α (the position in the direction perpendicular to the plan view such as FIG. 1) is between the vertical position of the winding β and the vertical position of the γ. It is not required that the winding α overlap the winding β or the winding γ when viewed in plan.

Figure 2A:
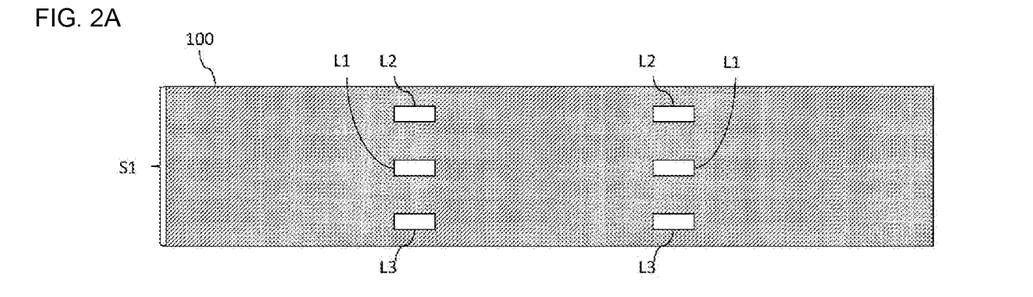
FIG. 2A is a sectional view of the transceiver module 100 taken along line A-A' in FIG. 1, illustrating an example in which a first winding L1 is disposed between a second winding L2 and a third winding L3.
Figure 2B:
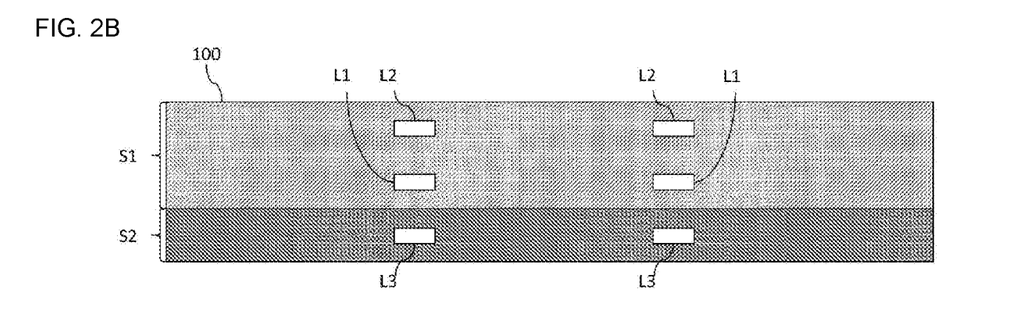
FIG. 2B is a sectional view of the transceiver module 100 taken along line A-A' in FIG. 1, illustrating another example in which the first winding L1 is disposed between the second winding L2 and the third winding L3.
Figure 2C:
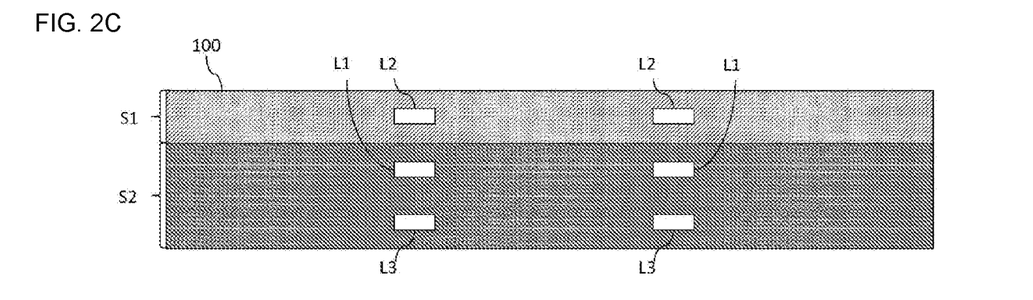
FIG. 2C is a sectional view of the transceiver module 100 taken along line A-A' in FIG. 1, illustrating still another example in which the first winding L1 is disposed between the second winding L2 and the third winding L3.
Figure 2D:
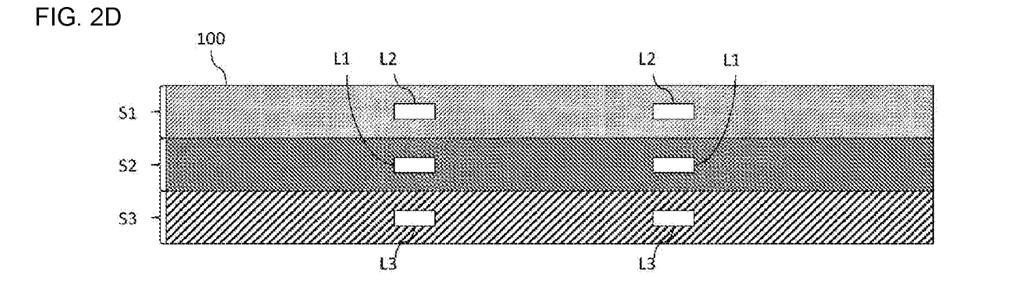
FIG. 2D is a sectional view of the transceiver module 100 taken along line A-A' in FIG. 1, illustrating yet still another example in which the first winding L1 is disposed between the second winding L2 and the third winding L3.

A layout may be as illustrated in FIG. 2A, where the second winding L2, the first winding L1, and the third winding L3 are disposed in the first layer S1. Another layout may be as illustrated in FIG. 2B, where the second winding L2 and the first winding L1 are disposed in the first layer S1, and the third winding L3 is disposed in the second layer S2. Still another layout may be as illustrated in FIG. 2C, where the second winding L2 is disposed in the first layer S1, and the first winding L1 and the third winding L3 are disposed in the second layer S2. Yet still another layout may be as illustrated in FIG. 2D, where the second winding L2 is disposed in the first layer S1, the first winding L1 is disposed in the second layer S2, and the third winding L3 is disposed in the third layer S3.

With the first winding L1 being disposed between the second winding L2 and the third winding L3, the second winding L2 and the third winding L3 are separated from each other by the first winding L1, and the magnetic coupling (mutual inductance) between the second winding L2 and the third winding L3 is reduced accordingly. This layout thus eliminates or reduces the possibility that the transmission signals TX will leak into the third winding L3 (the low-noise amplifier 31).

Figure 3A:
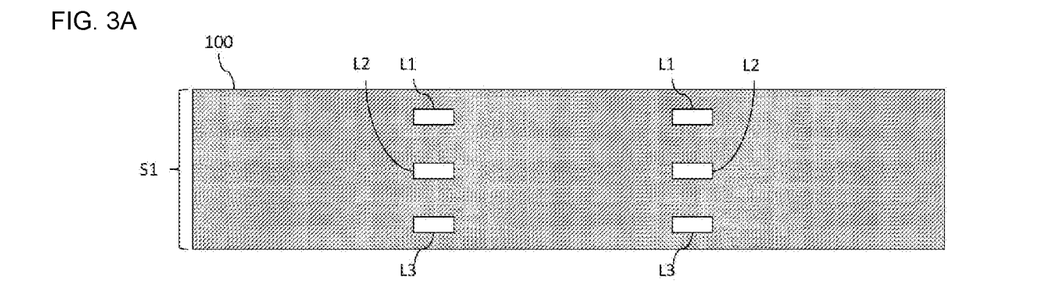
FIG. 3A is a sectional view of the transceiver module 100 taken along line A-A' in FIG. 1, illustrating an example in which the second winding L2 is disposed between the first winding L1 and the third winding L3.
Figure 3B:
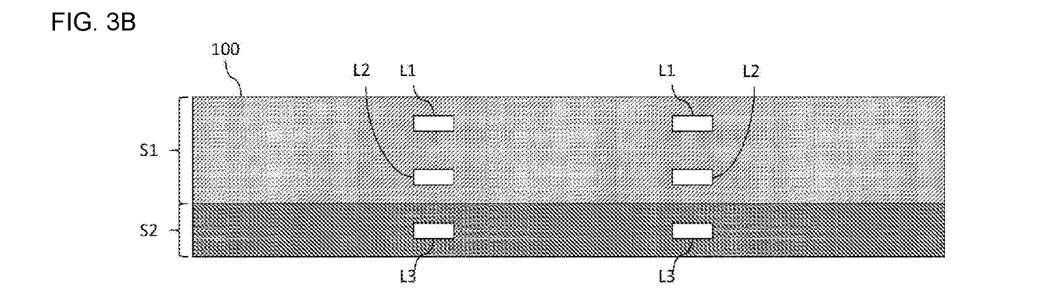
FIG. 3B is a sectional view of the transceiver module 100 taken along line A-A' in FIG. 1, illustrating another example in which the second winding L2 is disposed between the first winding L1 and the third winding L3.
Figure 3C:
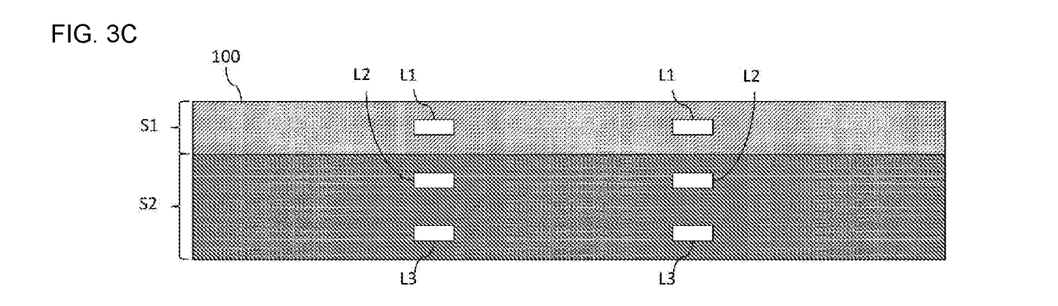
FIG. 3C is a sectional view of the transceiver module 100 taken along line A-A' in FIG. 1, illustrating still another example in which the second winding L2 is disposed between the first winding L1 and the third winding L3.
Figure 3D:
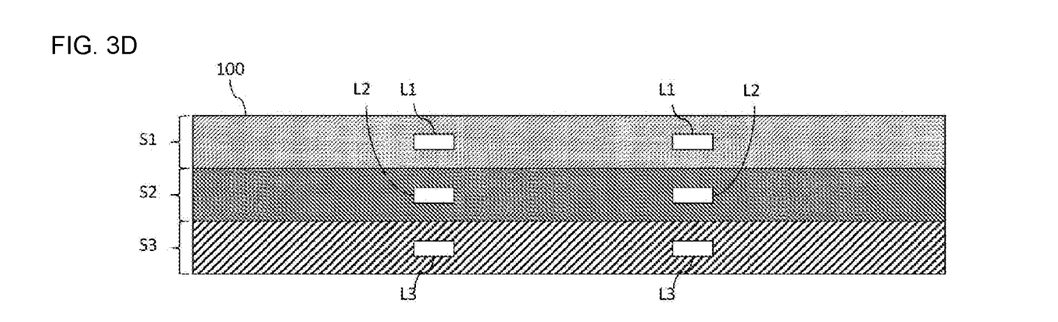
FIG. 3D is a sectional view of the transceiver module 100 taken along line A-A' in FIG. 1, illustrating yet still another example in which the second winding L2 is disposed between the first winding L1 and the third winding L3.

FIG. 3A to 3D are sectional views of the transceiver module 100 taken along line A-A' in FIG. 1, illustrating examples in which the second winding L2 is disposed between the first winding L1 and the third winding L3. A layout may be as illustrated in FIG. 3A, where the first winding L1, the second winding L2, and the third winding L3 are disposed in the first layer S1. Another layout may be as illustrated in FIG. 3B, where the first winding L1 and the second winding L2 are disposed in the first layer S1, and the third winding L3 is disposed in the second layer S2. Still another layout may be as illustrated in FIG. 3C, where the first winding L1 is disposed in the first layer S1, and the second winding L2 and the third winding L3 are disposed in the second layer S2. Yet still another layout may be as illustrated in FIG. 3D, where the first winding L1 is disposed in the first layer S1, the second winding L2 is disposed in the second layer S2, and the third winding L3 is disposed in the third layer S3.

With the second winding L2 being disposed between the first winding L1 and the third winding L3, the second winding L2 is close to the first winding L1, and the magnetic coupling (mutual inductance) between the first winding L1 and the second winding L2 may be increased accordingly.

Figure 4A:
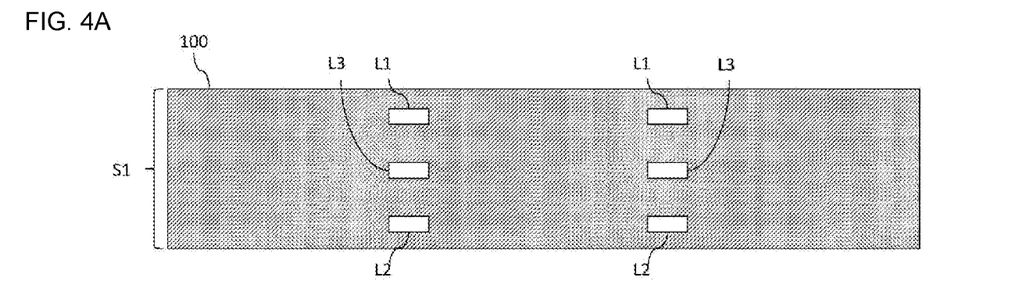
FIG. 4A is a sectional view of the transceiver module 100 taken along line A-A' in FIG. 1, illustrating an example in which the third winding L3 is disposed between the first winding L1 and the second winding L2.
Figure 4B:
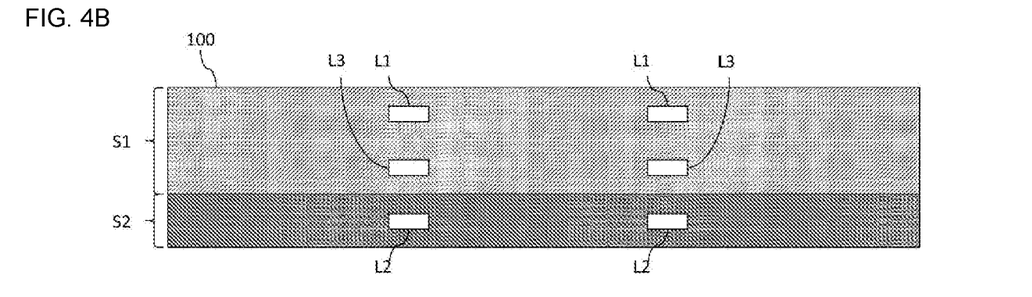
FIG. 4B is a sectional view of the transceiver module 100 taken along line A-A' in FIG. 1, illustrating another example in which the third winding L3 is disposed between the first winding L1 and the second winding L2.
Figure 4C:
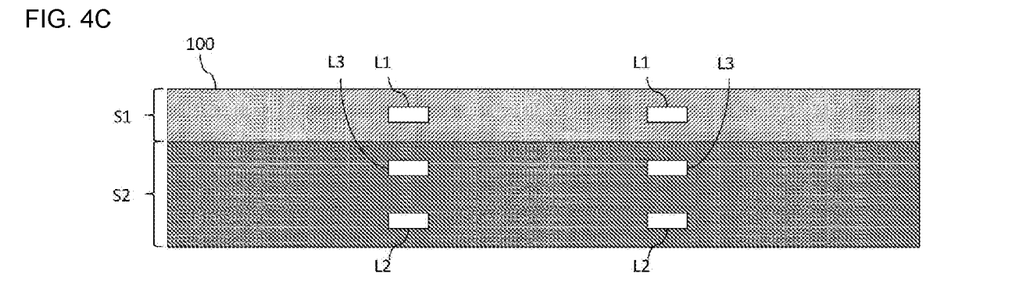
FIG. 4C is a sectional view of the transceiver module 100 taken along line A-A' in FIG. 1, illustrating still another example in which the third winding L3 is disposed between the first winding L1 and the second winding L2.
Figure 4D:
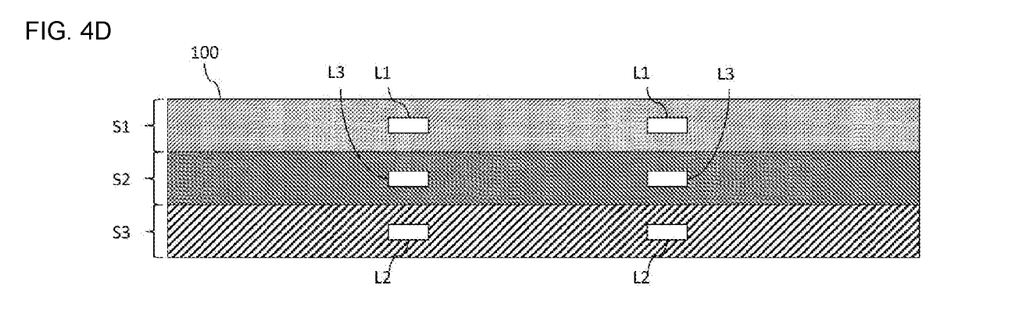
FIG. 4D is a sectional view of the transceiver module 100 taken along line A-A' in FIG. 1, illustrating yet still another example in which the third winding L3 is disposed between the first winding L1 and the second winding L2.

FIGS. 4A to 4D are sectional views of the transceiver module 100 taken along line A-A' in FIG. 1, illustrating examples in which the third winding L3 is disposed between the first winding L1 and the second winding L2. A layout may be as illustrated in FIG. 4A, where the first winding L1, the third winding L3, and the second winding L2 are disposed in the first layer S1. Another layout may be as illustrated in FIG. 4B, where the first winding L1 and the third winding L3 are disposed in the first layer S1, and the second winding L2 is disposed in the second layer S2. Still another layout may be as illustrated in FIG. 4C, where the first winding L1 is disposed in the first layer S1, and the third winding L3 and the second winding L2 are disposed in the second layer S2. Yet still another layout may be as illustrated in FIG. 4D, where the first winding L1 is disposed in the first layer S1, the third winding L3 is disposed in the second layer S2, and the second winding L2 is disposed in the third layer S3.

With the third winding L3 being disposed between the first winding L1 and the second winding L2, the third winding L3 is close to the first winding L1, and the magnetic coupling (mutual inductance) between the first winding L1 and the third winding L3 may be increased accordingly.

2. Operation

With reference to FIGS. 5A, 5B, 6A, and 6B, the following describes the operation of the transceiver module 100. Through the adoption of, for example, Time Division Duplex (TDD), the transceiver module 100 operates in a manner so as to switch from the transmission mode to the reception mode or vice versa in every time slot.

Figure 5A:
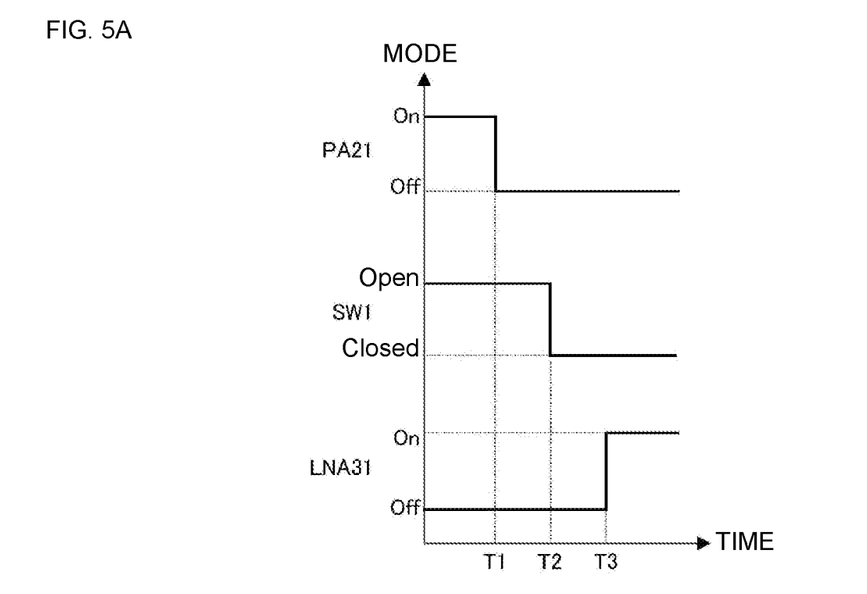
FIG. 5A is a timing chart of the transceiver module 100, illustrating switching from a transmission mode to a reception mode.

FIG. 5A is a timing chart of the transceiver module 100, illustrating switching from the transmission mode to the reception mode. At a time T1, the power amplifier 21 (PA21) switches from On to Off. Consequently, the power amplifier 21 stops amplifying the transmission signals TX and stops sending the transmission signals TX to the transformer TR1. Then, at a time T2, the switch SW1 switches from the open state to the closed state, and the circuit through which the reception signals RX are sent from the transformer TR2 to the low-noise amplifier 31 is closed. Subsequently, at a time T3, the low-noise amplifier 31 (LNA31) switches from Off to On and starts amplifying the reception signals RX. The switching from On to Off of the power amplifier 21 (the time T1) may be synchronized with the switching from the open state to the closed state of the switch SW1 (the time T2) through synchronization between the control signals SG2 for controlling the power amplifier 21 and the control signals SG1 for controlling the switch SW1. The switching time associated with switching between transmission and reception in TDD is typically of the order of milliseconds (msec). If this is the case, the switching time of the switch is preferably of the order of microseconds (μsec).

Figure 5B:
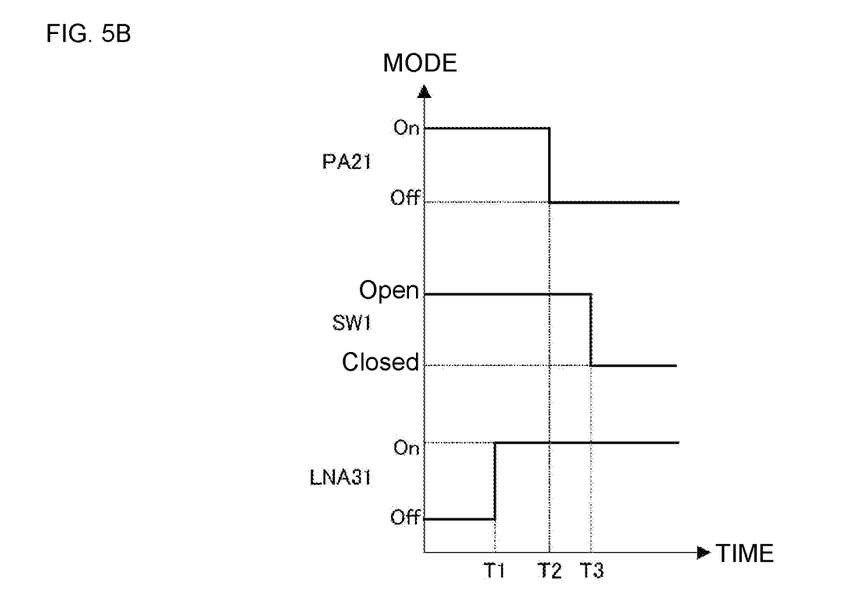
FIG. 5B is another timing chart of the transceiver module 100, illustrating switching from the transmission mode to the reception mode.

FIG. 5B is another timing chart of the transceiver module 100, illustrating switching from the transmission mode to the reception mode. At a time T1, the low-noise amplifier 31 switches from Off to On and becomes ready to amplify the reception signals RX. Then, at a time T2, the power amplifier 21 switches from On to Off. Consequently, the power amplifier 21 stops amplifying the transmission signals TX and stops sending the transmission signals TX to the transformer TR1. Subsequently, at a time T3, the switch SW1 switches from the open state to the closed state, and the circuit through which the reception signals RX are sent from the transformer TR2 to the low-noise amplifier 31 is closed. The low-noise amplifier 31 then starts amplifying the reception signals RX. The switching from On to Off of the power amplifier 21 (the time T2) may be synchronized with the switching from the open state to the closed state of the switch SW1 (the time T3) through synchronization between the control signals SG2 for controlling the power amplifier 21 and the control signals SG1 for controlling the switch SW1.

Figure 6A:
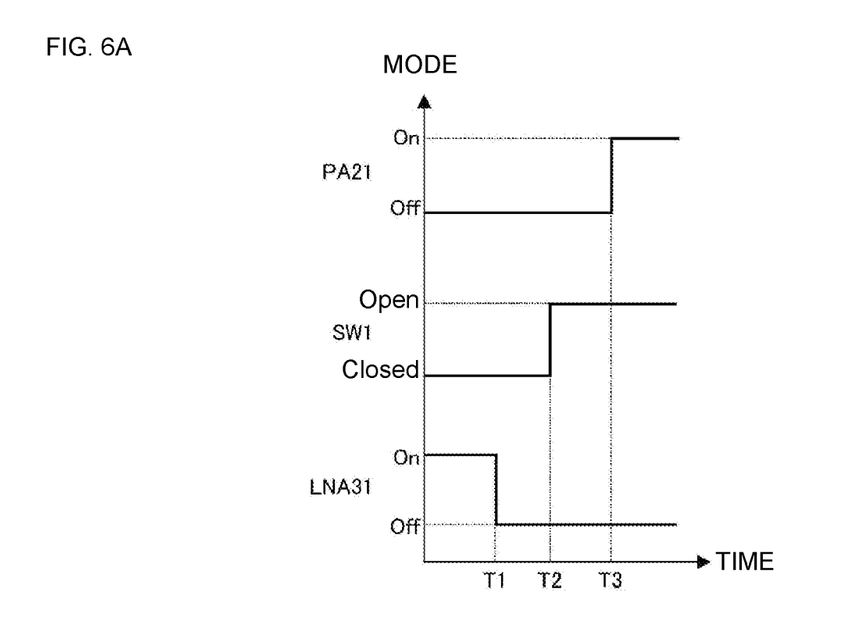
FIG. 6A is still another timing chart of the transceiver module 100, illustrating switching from the reception mode to the transmission mode.

FIG. 6A is still another timing chart of the transceiver module 100, illustrating switching from the reception mode to the transmission mode. At a time T1, the low-noise amplifier 31 switches from On to Off and stops amplifying the reception signals RX. At a time T2, the switch SW1 switches from the closed state to the open state, and the circuit through which the reception signals RX are sent from transformer TR2 to the low-noise amplifier 31 is opened and is then kept unclosed. Subsequently, at a time T3, the power amplifier 21 switches from Off to On. Consequently, the power amplifier 21 starts amplifying the transmission signals TX and starts sending the transmission signals TX to the transformer TR1. The switching from Off to On of the power amplifier 21 (the time T3) may be synchronized with the switching from the closed state to the open state of the switch SW1 (the time T2) through synchronization between the control signals SG2 for controlling the power amplifier 21 and the control signals SG1 for controlling the switch SW1.

Figure 6B:
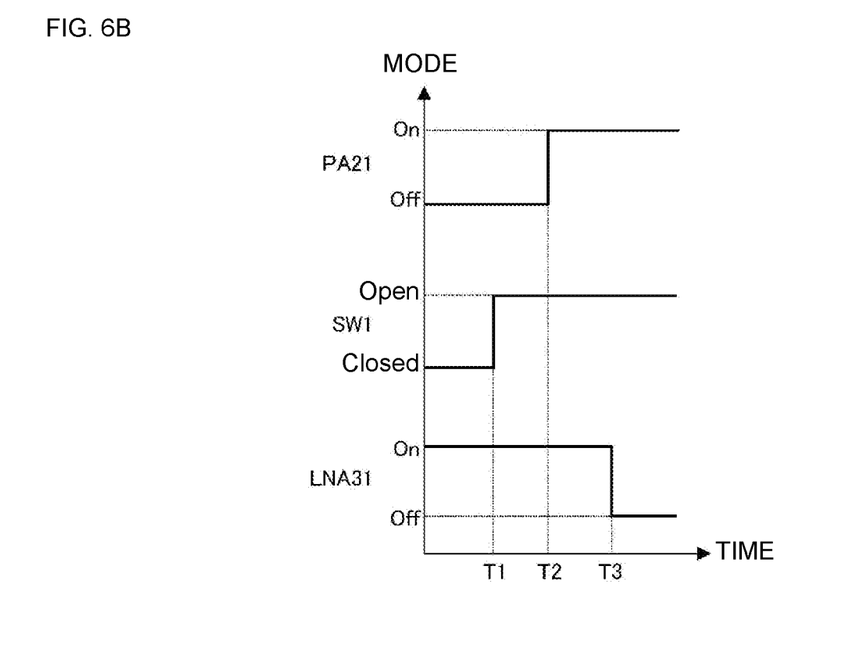
FIG. 6B is yet still another timing chart of the transceiver module 100, illustrating switching from the reception mode to the transmission mode.

FIG. 6B is yet still another timing chart of the transceiver module 100, illustrating switching from the reception mode to the transmission mode. At a time T1, the switch SW1 switches from the closed state to the open state, and the circuit through which the reception signals RX are sent from the transformer TR2 to the low-noise amplifier 31 is opened and is then kept unclosed. Consequently, the reception signal RX are not sent to the low-noise amplifier 31, which in turn stops amplifying the reception signals RX. Then, at a time T2, the power amplifier 21 switches from Off to On. Consequently, the power amplifier 21 starts amplifying the transmission signals TX and starts sending the transmission signals TX to the transformer TR1. Subsequently, at a time T3, the low-noise amplifier 31 switches from On to Off. The switching from Off to On of the power amplifier 21 (the time T2) may be synchronized with the switching from the closed state to the open state of the switch SW1 (the time T1) through synchronization between the control signals SG2 for controlling the power amplifier 21 and the control signals SG1 for controlling the switch SW1. Referring to FIGS. 5A to 6B, while the power amplifier 21 is On, it is ensured that the switch SW1 is open; that is, the circuit through which the reception signals RX are sent from the transformer TR2 to the low-noise amplifier 31 is kept unclosed. This operation eliminates or reduces the possibility that the transmission signals TX will leak into the low-noise amplifier 31.

Modification

Figure 7:
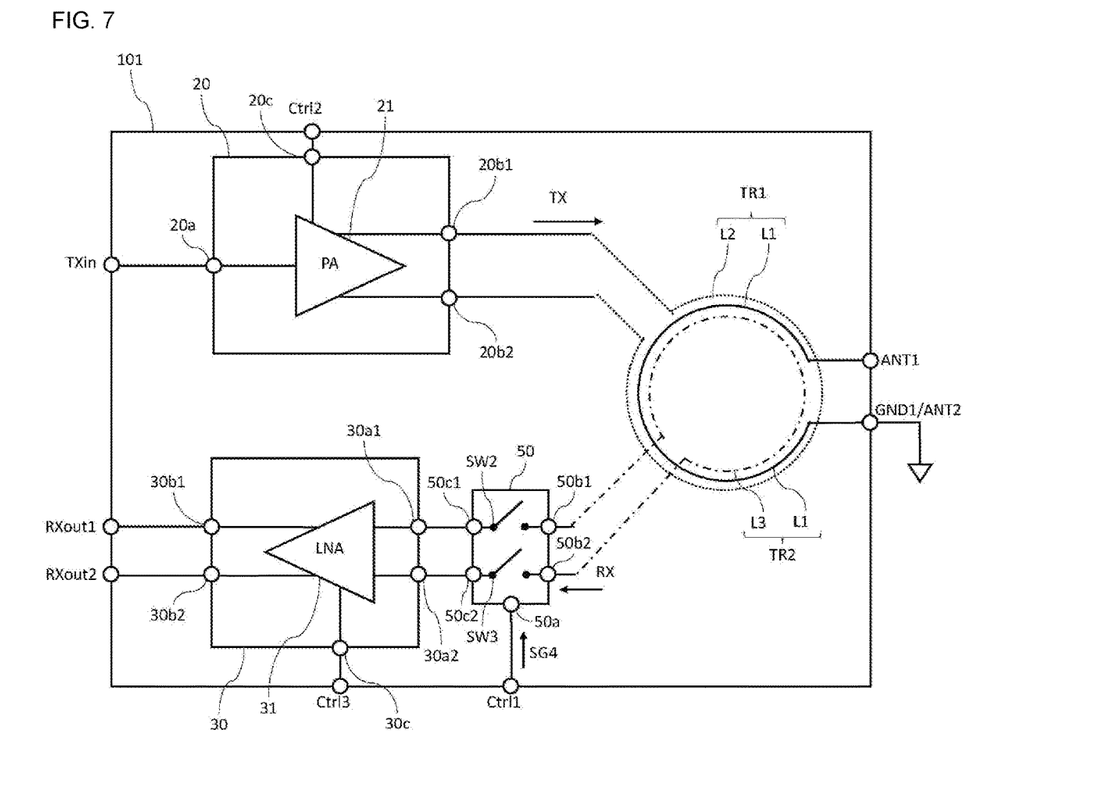
FIG. 7 is a schematic configuration diagram of a transceiver module 101 according to a modification of the first embodiment of the present disclosure.

FIG. 7 is a schematic configuration diagram of a transceiver module 101 according to a modification of the first embodiment of the present disclosure. The low-noise amplifier 31 included in the LNA module 30 of the transceiver module 101 is a differential amplifier. The LNA module 30 has: a terminal 30*a*1 and a terminal 30*a*2, which are connected to the input terminal of the low-noise amplifier 31; a terminal 30*b*1 and a terminal 30*b*2, which are connected to the output terminal of the low-noise amplifier 31; and the terminal 30*c* connected to the control terminal of the low-noise amplifier 31.

The transceiver module 101 includes a switch module 50, which is disposed on the input side of the low-noise amplifier 31. The switch module 50 is an example of a switch unit and includes a switch SW2 (a first switch) and a switch SW3 (a second switch). Each of the switches SW2 and SW3 may be a bipolar transistor or a field effect transistor (FET). The switch module 50 has a terminal 50*a*, a terminal 50*b*1, a terminal 50*b*2, a terminal 50*c*1, and a terminal 50*c*2.

The terminal 50*a* is connected to the terminal Ctrl1 of the transceiver module 101. Control signals SG4 for controlling the switches SW2 and SW3 are inputted to the terminal Ctrl1. The signals applied to the terminal Ctrl1, namely, the control signals SG4 for controlling the switches SW2 and SW3 are respectively sent to the switches SW2 and SW3 through the terminal 50*a*. The control signals SG4 may be synchronized with the aforementioned control signals SG2 for controlling the power amplifier 21.

Each of the switches SW2 and SW3 is an example of a switch for opening or closing a circuit through which the reception signals RX are sent from the transformer TR2 to the low-noise amplifier 31. One end of the switch SW2 is connected to the terminal 50*b*1, and the other end of the switch SW2 is connected to the terminal 50*c*1. The switch SW2 switches between an open state and a closed state in accordance with the control signals SG4 sent through the terminal 50*a*. One end of the switch SW3 is connected to the terminal 50*b*2, and the other end of the switch SW3 is connected to the terminal 50*c*2. The switch SW3 switches between an open state and a closed state in accordance with the control signals SG4 sent through the terminal 50*a*.

While at least one of the switches SW2 and SW3 is open, the circuit through which the reception signals RX are sent from the transformer TR2 to the low-noise amplifier 31 is kept unclosed. While both of the switches SW2 and SW3 are closed, the circuit through which the reception signals RX are sent from the transformer TR2 to the low-noise amplifier 31 is closed.

As described above, the transceiver module according to the present embodiment includes a power amplifier, a first transformer, a low-noise amplifier, and a second transformer. The power amplifier amplifies a transmission signal for outputting to an antenna terminal. The first transformer includes a first winding and a second winding. The first winding is connected to the antenna terminal, and the second winding is connected to an output side of the power amplifier. The low-noise amplifier amplifies a reception signal inputted through the antenna terminal. The second transformer includes the first winding and a third winding connected to an input side of the low-noise amplifier. The second transformer enables impedance conversion between the antenna terminal and the low-noise amplifier. The transceiver module thus eliminates the need to include an impedance matching circuit between the second transformer and the low-noise amplifier.

The power amplifier of the transceiver module may be a differential amplifier. This feature brings advantages to transmission signals, such as improved noise-suppression performance, increased gains, and reduced even-order harmonic distortion.

The low-noise amplifier of the transceiver module may be a differential amplifier. This feature brings advantages to reception signals, such as improved noise-suppression performance, increased gains, and reduced even-order harmonic distortion.

The transceiver module may also include a switch unit for opening or closing a circuit through which a reception signal is sent from the second transformer to the low-noise amplifier. This feature eliminates or reduces the possibility that transmission signals will leak into the low-noise amplifier.

One end of the switch unit of the transceiver module may be connected to an end of the third winding, and the other end of the switch unit may be connected to the ground. This feature eliminates or reduces the possibility that transmission signals will leak into the low-noise amplifier.

The low-noise amplifier of the transceiver module may be a differential amplifier. The switch unit of the transceiver module may include a first switch and a second switch. One end of the first switch may be connected to an end of the third winding, and the other end of the first switch may be connected to an input terminal of the low-noise amplifier. One end of the second switch may be connected to the other end of the third winding, and the other end of the second switch may be connected to another input terminal of the low-noise amplifier. This feature eliminates or reduces the possibility that transmission signals will leak into the low-noise amplifier.

In the transceiver module, the first winding may be disposed between the second winding and the third winding. The second winding and the third winding are separated from each other by the first winding, and the magnetic coupling (mutual inductance) between the second winding and the third winding is reduced accordingly. This feature thus eliminates or reduces the possibility that transmission signals will leak into the third winding (the low-noise amplifier).

The transceiver module may also include a first layer in which the second winding, the first winding, and the third winding are disposed. This feature helps simplify the configuration of the transceiver module.

Alternatively, the transceiver module may also include: a first layer in which the second winding and the first winding are disposed; and a second layer in which the third winding is disposed. This feature helps simplify the configuration of the transceiver module and provides ease of arranging the windings.

Alternatively, the transceiver module may also include: a first layer in which the second winding is disposed; and a second layer in which the first winding and the third winding are disposed. This feature helps simplify the configuration of the transceiver module and provides ease of arranging the windings.

Alternatively, the transceiver module may also include: a first layer in which the second winding is disposed; a second layer in which the first winding is disposed; and a third layer in which the third winding is disposed. This feature provides ease of arranging the windings.

In the transceiver module, the second winding may be disposed between the first winding and the third winding. The second winding is close to the first winding, and the magnetic coupling (mutual inductance) between the first winding and the second winding may be increased accordingly.

The transceiver module may also include a first layer in which the first winding, the second winding, and the third winding are disposed. This feature helps simplify the configuration of the transceiver module.

Alternatively, the transceiver module may also include: a first layer in which the first winding and the second winding are disposed; and a second layer in which the third winding is disposed. This feature helps simplify the configuration of the transceiver module and provides ease of arranging the windings.

Alternatively, the transceiver module may also include: a first layer in which the first winding is disposed; and a second layer in which the second winding and the third winding are disposed. This feature helps simplify the configuration of the transceiver module and provides ease of arranging the windings.

Alternatively, the transceiver module may also include: a first layer in which the first winding is disposed; a second layer in which the second winding is disposed; and a third layer in which the third winding is disposed. This feature provides ease of arranging the windings.

In the transceiver module, the third winding may be disposed between the first winding and the second winding. The third winding is close to the first winding, and the magnetic coupling (mutual inductance) between the first winding and the third winding may be increased accordingly.

The transceiver module may also include a first layer in which the first winding, the third winding, and the second winding are disposed. This feature helps simplify the configuration of the transceiver module.

Alternatively, the transceiver module may also include: a first layer in which the first winding and the third winding are disposed; and a second layer in which the second winding is disposed. This feature helps simplify the configuration of the transceiver module and provides ease of arranging the windings.

Alternatively, the transceiver module may also include: a first layer in which the first winding is disposed; and a second layer in which the third winding and the second winding are disposed. This feature helps simplify the configuration of the transceiver module and provides ease of arranging the windings.

Alternatively, the transceiver module may also include: a first layer in which the first winding is disposed; a second layer in which the third winding is disposed; and a third layer in which the second winding is disposed. This feature provides ease of arranging the windings.

The embodiments above have been described to facilitate the understanding of the present disclosure and should not be construed as limiting the scope of the present disclosure. Constituent components in the embodiments above and the arrangement, materials, conditions, shapes, and sizes of the constituent components are not limited to those mentioned in the description and may be changed as appropriate. Partial replacements or combinations of configurations illustrated in different embodiments are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A transceiver module comprising:
   a power amplifier that amplifies a transmission signal for output to an antenna terminal;
   a first transformer including a first winding and a second winding, the first winding being connected to the antenna terminal, the second winding being connected to an output side of the power amplifier;
   a low-noise amplifier that amplifies a reception signal inputted through the antenna terminal;
   a second transformer including the first winding and a third winding connected to an input side of the low-noise amplifier, the first winding of the first transformer is the same winding as the first winding of the second transformer; and
   a switch unit for opening or closing a circuit through which a reception signal is sent from the second transformer to the low-noise amplifier.

2. The transceiver module according to claim 1, wherein at least one of the power amplifier or the low-noise amplifier is a differential amplifier.

3. The transceiver module according to claim 1, wherein the switch unit includes a switch, one end of the switch being connected to an end of the third winding, and another end of the switch being connected to ground.

4. The transceiver module according to claim 1, wherein
   the low-noise amplifier is a differential amplifier, and
   the switch unit includes a first switch and a second switch, one end of the first switch being connected to a first end of the third winding, another end of the first switch being connected to a first input terminal of the low-noise amplifier, one end of the second switch being connected to a second end of the third winding, and another end of the second switch being connected to a second input terminal of the low-noise amplifier.

5. The transceiver module according to claim 1, wherein the first winding is disposed between the second winding and the third winding.

6. The transceiver module according to claim 5, further comprising a first layer in which the second winding, the first winding, and the third winding are disposed.

7. The transceiver module according to claim 5, further comprising:
   a first layer in which the second winding and the first winding are disposed; and
   a second layer in which the third winding is disposed.

8. The transceiver module according to claim 5, further comprising:
   a first layer in which the second winding is disposed; and
   a second layer in which the first winding and the third winding are disposed.

9. The transceiver module according to claim 5, further comprising:
   a first layer in which the second winding is disposed;
   a second layer in which the first winding is disposed; and
   a third layer in which the third winding is disposed.

10. The transceiver module according to claim 1, wherein the second winding is disposed between the first winding and the third winding.

11. The transceiver module according to claim 10, further comprising a first layer in which the first winding, the second winding, and the third winding are disposed.

12. The transceiver module according to claim 10, further comprising:
    a first layer in which the first winding and the second winding are disposed; and
    a second layer in which the third winding is disposed.

13. The transceiver module according to claim 10, further comprising:
    a first layer in which the first winding is disposed; and
    a second layer in which the second winding and the third winding are disposed.

14. The transceiver module according to claim 10, further comprising:
- a first layer in which the first winding is disposed;
- a second layer in which the second winding is disposed; and
- a third layer in which the third winding is disposed.

15. The transceiver module according to claim 1, wherein the third winding is disposed between the first winding and the second winding.

16. The transceiver module according to claim 15, further comprising a first layer in which the first winding, the third winding, and the second winding are disposed.

17. The transceiver module according to claim 15, further comprising:
- a first layer in which the first winding and the third winding are disposed; and
- a second layer in which the second winding is disposed.

18. The transceiver module according to claim 15, further comprising:
- a first layer in which the first winding is disposed; and
- a second layer in which the third winding and the second winding are disposed.

19. The transceiver module according to claim 15, further comprising:
- a first layer in which the first winding is disposed;
- a second layer in which the third winding is disposed; and
- a third layer in which the second winding is disposed.

* * * * *